(12) United States Patent
Cai et al.

(10) Patent No.: US 12,239,023 B2
(45) Date of Patent: Feb. 25, 2025

(54) ELECTRONIC DEVICE

(71) Applicant: VIVO MOBILE COMMUNICATION CO., LTD., Guangdong (CN)

(72) Inventors: Cheng Cai, Guangdong (CN); Qingbin Cai, Guangdong (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 197 days.

(21) Appl. No.: 17/991,440

(22) Filed: Nov. 21, 2022

(65) Prior Publication Data
US 2023/0089414 A1 Mar. 23, 2023

Related U.S. Application Data

(63) Continuation of application No. PCT/CN2021/095943, filed on May 26, 2021.

(30) Foreign Application Priority Data

May 27, 2020 (CN) .......................... 202010463367.2

(51) Int. Cl.
*G06F 1/16* (2006.01)
*H10N 30/00* (2023.01)

(52) U.S. Cl.
CPC ......... *H10N 30/101* (2024.05); *G06F 1/1601* (2013.01); *G06F 1/1626* (2013.01); *G06F 1/163* (2013.01)

(58) Field of Classification Search
CPC ...... G06F 1/1601; G06F 1/1626; H04N 23/57
See application file for complete search history.

(56) References Cited

U.S. PATENT DOCUMENTS 10,938,969 B2 * 3/2021 Li .................... F16M 11/046
2009/0005135 A1 1/2009 Lindgren et al.
(Continued)

FOREIGN PATENT DOCUMENTS

CN 101206297 A 6/2008
CN 108494286 A 9/2018
(Continued)

OTHER PUBLICATIONS

Translation of CN_210578670 (Year: 2024).*
(Continued)

*Primary Examiner* — Sagar Shrestha
(74) *Attorney, Agent, or Firm* — Fredrikson & Byron, P.A.

(57) ABSTRACT

Disclosed is an electronic device. The electronic device includes a housing provided with an opening, a functional device movably mounted on the housing, and a driving mechanism and a transmission mechanism mounted in the housing. The driving mechanism includes a piezoelectric device that vibrates when being energized. The transmission mechanism includes a cam disposed at an inner side of the functional device and including a wheel body mounted on the piezoelectric device and a protruding portion disposed at a wheel rim of the wheel body. The piezoelectric device drives the cam to rotate between a first location and a second location. When the cam is at the first location, the functional device is located in the housing. When the cam is at the second location, the protruding portion drives at least part of the functional device to extend out of the housing from the opening.

13 Claims, 6 Drawing Sheets

(56) References Cited

U.S. PATENT DOCUMENTS

| | | | | |
|---|---|---|---|---|
| 2018/0113276 A1* | 4/2018 | Hosokawa | ........... | G02B 27/646 |
| 2021/0281723 A1* | 9/2021 | Wang | .................. | H04M 1/0264 |

FOREIGN PATENT DOCUMENTS

| | | |
|---|---|---|
| CN | 108811416 A | 11/2018 |
| CN | 108924310 A | 11/2018 |
| CN | 208052117 U | 11/2018 |
| CN | 109246342 A | 1/2019 |
| CN | 208572158 U | 3/2019 |
| CN | 109862236 A | 6/2019 |
| CN | 109962995 A | 7/2019 |
| CN | 109963001 A | 7/2019 |
| CN | 109995905 A | 7/2019 |
| CN | 110086902 A | 8/2019 |
| CN | 110545346 A | 12/2019 |
| CN | 110545369 A | 12/2019 |
| CN | 110557480 A | 12/2019 |
| CN | 110601596 A | 12/2019 |
| CN | 110933210 A | 3/2020 |
| CN | 210129880 U | 3/2020 |
| CN | 210578670 U | 5/2020 |
| CN | 111614817 A | 9/2020 |
| EP | 3139584 A1 | 3/2017 |
| EP | 3481035 A1 | 5/2019 |
| JP | 51099270 U | 8/1976 |
| JP | H01157594 A | 6/1989 |
| JP | H09314968 A | 12/1997 |
| JP | H10127068 A | 5/1998 |
| KR | 1020100089334 A | 8/2010 |
| KR | 101893166 B1 | 8/2018 |
| KR | 1020190084585 A | 7/2019 |
| WO | 03077410 A1 | 9/2003 |
| WO | 2019015651 A1 | 1/2019 |
| WO | 2019128590 A1 | 7/2019 |

OTHER PUBLICATIONS

Translation of CN110086902 (Year: 2024).*
Translation of CN110545369 (Year: 2024).*
International Patent Application No. PCT/CN2021/095943, International Search Report and Written Opinion with Partial English Machine Translation mailed Aug. 31, 2021, 10 pages.
European Patent Office "Extended European Search Report" For Application No. 21812463.4, dated Oct. 9, 2023, pp. 10.
Intellectual Property India, "Examination Report" From Application No. 202217074979, Dated Sep. 5, 2024, pp. 6.

* cited by examiner

ELECTRONIC DEVICE

CROSS-REFERENCE TO RELATED APPLICATIONS

The present application is a continuation of International Application No. PCT/CN2021/095943, filed on May 26, 2021, which claims priority to Chinese Patent Application No. 202010463367.2, filed with the Chinese Patent Office on May 27, 2020, and entitled "ELECTRONIC DEVICE", which is incorporated herein by reference in its entirety.

TECHNICAL FIELD

The present application relates to the technical field of communication devices, and in particular, to an electronic device.

BACKGROUND

Technological innovations enable the types of the electronic devices to be gradually increased, and the development process of a wearable smart device represented by a smart watch is extremely fast. An acoustic device is disposed on the smart watch, so that the smart watch has a call function, and some smart watches are further equipped with cameras, so that the smart watches have a video call function. In the current smart watch, a functional device, such as the camera, is generally fixed beside a display screen, however, this arrangement causes that a screen-to-body ratio of the smart watch is relatively small, and if the smart watch collides, it extremely causes damage to the functional device.

SUMMARY

An electronic device is provided, which includes:
a housing, provided with an opening;
a functional device, movably mounted on the housing;
a driving mechanism, mounted in the housing and including a piezoelectric device, where the piezoelectric device vibrates when being energized; and
a transmission mechanism, including a cam, where the cam is disposed at an inner side of the functional device, the cam includes a wheel body and a protruding portion, the protruding portion is disposed at a wheel rim of the wheel body, the wheel body is mounted on the piezoelectric device, and the piezoelectric device drives the cam to rotate between a first location and a second location; and
in a case that the cam is at the first location, the functional device is located in the housing, and in a case that the cam is at the second location, the protruding portion drives at least part of the functional device to extend out of the housing from the opening.

BRIEF DESCRIPTION OF THE DRAWINGS

The accompanying drawings described herein are used for providing further understanding of the present application, and constitute a part of the present application. The exemplary embodiments of the present application and the descriptions thereof are used to explain the present application, and do not constitute any inappropriate limitation to the present application. In the accompanying drawings.

DESCRIPTION OF REFERENCE NUMERALS

Figure 1:
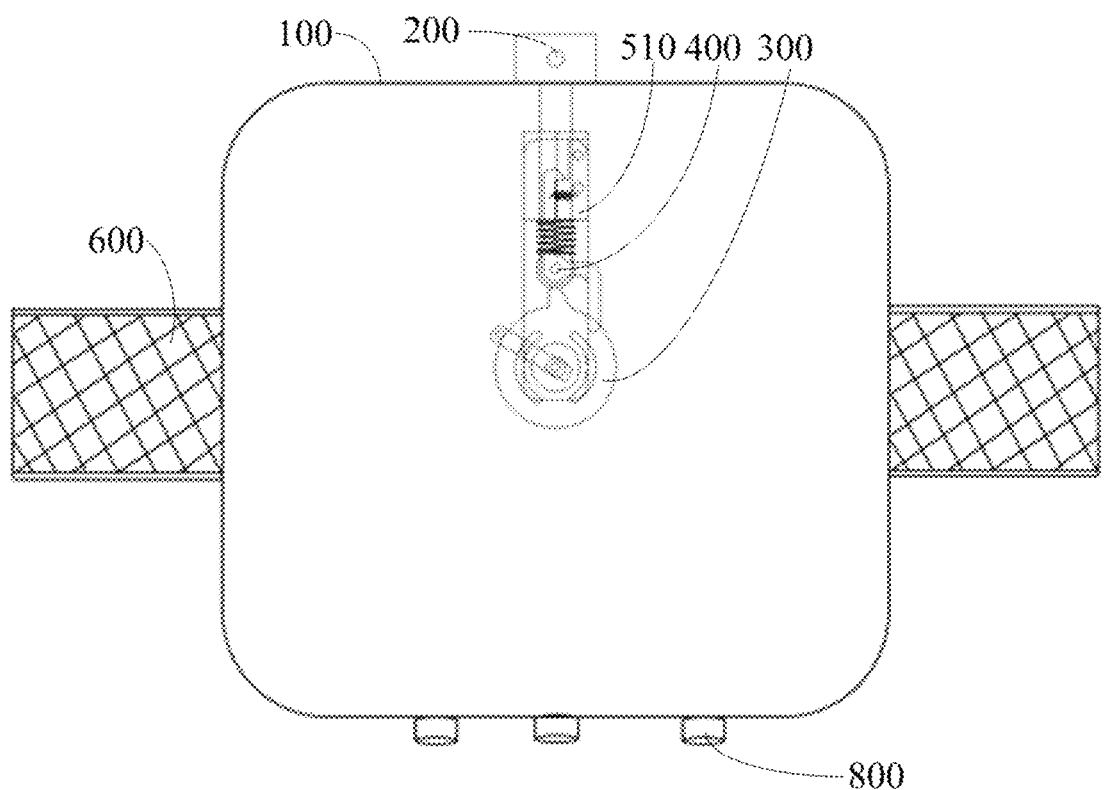
FIG. 1 is a schematic structural diagram of an electronic device disclosed in embodiments of the present application.

100: housing, 110: positioning groove
200: functional device
300: driving mechanism, 310: piezoelectric device, 320: elastic layer, 330: wear-resistant layer
400: transmission mechanism, 410: cam, 411: wheel body, 412: protruding portion, 412a: guide surface, 413: rotating rod, 420: reset portion, 430: elastic portion, 440: connection portion, 450: positioning portion, 451: positioning hook, 452: blocking segment, 460: pulley
510: guide rail
600: watch band
700: power supply
800: operation button.

DETAILED DESCRIPTION

To describe the purpose, the technical solutions and the advantages of the present application more clearly, the technical solutions of the present application are clearly described below with reference to the specific embodiments and the corresponding accompanying drawings of the present application. Apparently, the described embodiments are merely some of the embodiments of the present application, but not all the embodiments. Based on the embodiments of the present application, all other embodiments obtained by a person of ordinary skill in the art without involving an inventive effort shall fall within the scope of protection of the present application.

The technical solutions disclosed in various embodiments of the present application are described in detail below with reference to the accompanying drawings.

As shown in FIG. 1 to FIG. 11, the embodiments of the present application disclose an electronic device which can be a smart phone, a tablet computer, an E-book reader, or a wearable device.

As shown in FIG. 1, the electronic device includes a housing 100, a functional device 200, a driving mechanism 300, and a transmission mechanism 400. An opening is formed on the housing 100; moreover, the functional device 200 is movably mounted on the housing 100; the driving mechanism 300 is connected to the transmission mechanism 400; and the transmission mechanism 400 cooperates with the functional device 200, so that at least part of the functional device 200 can extend out of the housing 100 from the opening, and the functional device 200 retracts into the housing 100 from the opening. Optionally, the functional device 200 can include at least one of a camera, a sensor, a receiver, and a light supplementing lamp.

Figure 2:
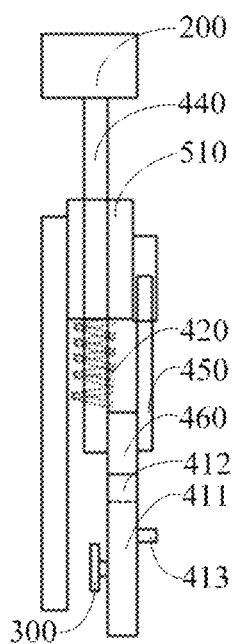
FIG. 2 is a schematic diagram of part of a structure of an electronic device shown in FIG. 1.
Figure 3:
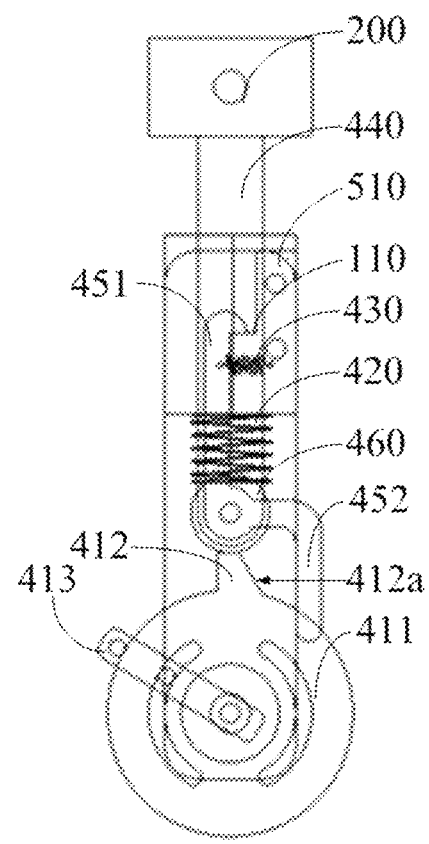
FIG. 3 is a schematic diagram of a structure shown in FIG. 2 in another direction.
Figure 4:
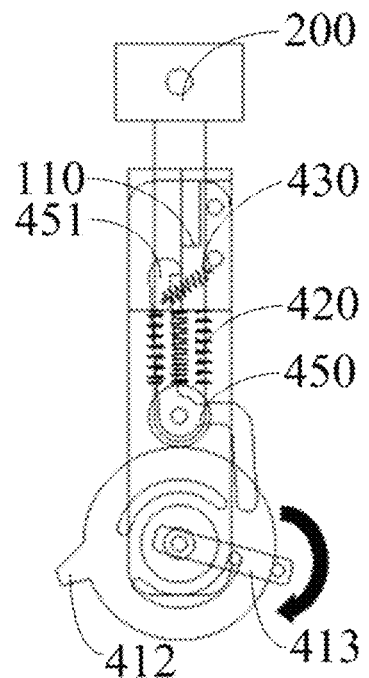
FIG. 4 is a first state diagram of parts in a movement process in an electronic device shown in FIG. 1.
Figure 5:
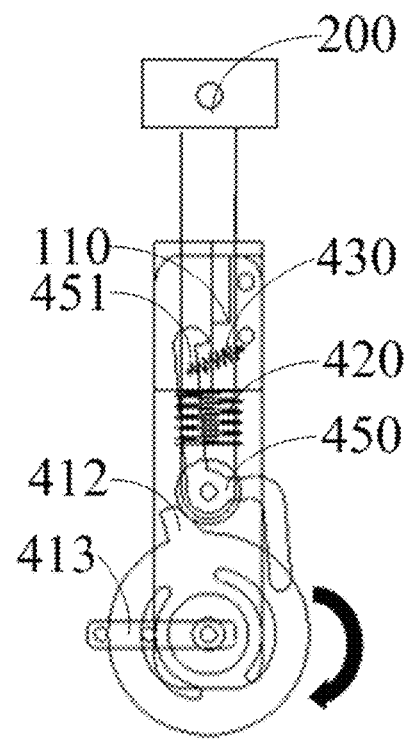
FIG. 5 is a second state diagram of parts in a movement process in an electronic device shown in FIG. 1.
Figure 10:
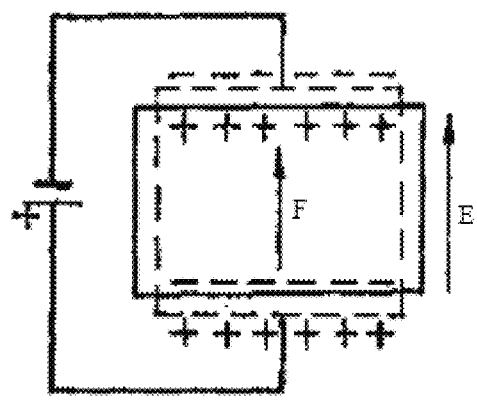
FIG. 10 is a schematic working principle diagram of a piezoelectric device in an electronic device disclosed in embodiments of the present application.
Figure 11:
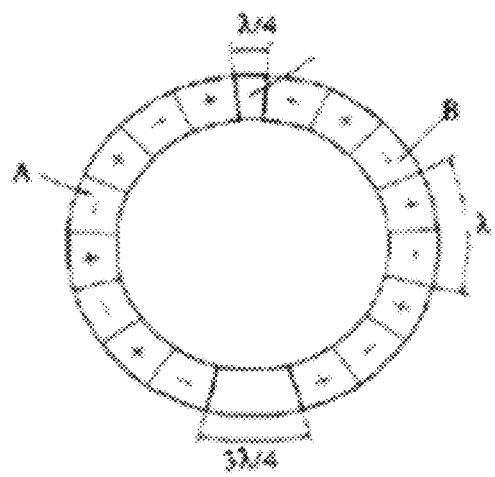
FIG. 11 is a schematic diagram of a polarized state of a piezoelectric device in an electronic device disclosed in embodiments of the present application.

As shown in FIG. 1 to FIG. 3, the driving mechanism 300 is mounted in the housing 100, the driving mechanism 300 includes a piezoelectric device 310, the piezoelectric device 310 is made of a piezoelectric material, and the piezoelectric device 310 vibrates when being energized. Optionally, the piezoelectric device 310 can be of an annular structure. As shown in FIG. 10 and FIG. 11, the piezoelectric device 310 includes polarized A and B phase regions, the polarization directions of the A phase region and the B phase region are opposite, E is an electric field direction, and F is a polarization direction. The piezoelectric device 310 can be connected to a power supply 700 in the electronic device through a wire. In a case that the power supply 700 applies an electrical signal to the piezoelectric device 310, the piezoelectric device 310 will alternately stretch and retract for deformation, so that the piezoelectric device 310 can generate traveling waves rotating along an annular circumferential direction, and any point on a surface of the piezoelectric device 310 can generate ultrasonic vibration according to an elliptical trajectory to rub with the transmission mechanism 400, and thus, the transmission mechanism 400 rotates.

No electromagnetic interference is generated in the working process of the piezoelectric device 310, and there is almost no noise during working, so that the user experience is relatively good and there is no need to configure a deceleration mechanism for the driving mechanism 300, and thus, the whole structure of the electronic device is more concise. Optionally, the piezoelectric device 310 can be a piezoelectric ceramic formed of BaTiO3 (barium tatanate), or can also be PZT, i.e., a binary piezoelectric ceramic with the chemical formula of PbPb(Zr11xTix)O3, so that it is ensured that the piezoelectric device 310 has good comprehensive performance.

Further, as shown in FIG. 11, an unpolarized region of $\lambda/4$ can be clamped between the A phase region and the B phase region, and the unpolarized region can be used as a sensor for controlling the power supply to feed back a signal, and the other region of a $3\lambda/4$ wavelength between the A phase region and the B phase region can be used as a public region. The voltage and frequency of the piezoelectric device 310 can be determined according to actual conditions, and are not limited herein.

As shown in FIG. 1 to FIG. 3 and FIG. 9, the transmission mechanism 400 includes a cam 410; the cam 410 is disposed at an inner side of the functional device 200, and the cam 410 is mounted on the piezoelectric device 310; the piezoelectric device 310 drives the cam 410 to rotate between a first location and a second location; and on the basis of the structural features of the cam 410, by mounting the cam 410 at the inner side of the functional device 200, in a case that a position of the cam 410 that is in contact with the functional device 200 is changed, a distance between the center of rotation of the cam 410 and the functional device 200 is also changed.

As shown in FIG. 1 to FIG. 3, the cam 410 can include a wheel body 411 and a protruding portion 412; the protruding portion 412 is connected to a wheel rim of the wheel body 411; and compared with a condition that the wheel body 411 is in contact with the functional device 200, in a case that the protruding portion 412 is in contact with the functional device 200, a distance between the functional device 200 and the center of rotation of the cam 410 can be larger. Therefore, in a case that the protruding portion 412 of the cam 410 is in contact with the functional device 200, the location of the cam 410 can be set to be the second location, and in a case that the wheel body 411 of the cam 410 is in contact with the functional device 200, the location of the cam 410 can be set to be the first location. In a case that the cam 410 is at the first location, the functional device 200 is located in the housing 100, and in a case that the cam 410 is at the second location, the cam 410 can drive at least part of the functional device 200 to extend out of the housing 100 from the opening. It should be noted that in a case that the protruding portion 412 of the cam 410 is not in contact with the functional device 200, the functional device 200 can retract into the housing 100 in a manual push-back manner to be in contact with the wheel body 411 of the cam 410.

The transmission mechanism 400 of the electronic device disclosed in the embodiments of the present application includes the cam 410, the location of the cam 410 can be changed through the piezoelectric device 310, and the mounting and working space occupied by the transmission mechanism 400, i.e., the cam 410, is relatively small, and thus, the structure is simple and compact, it is convenient to design and easy to manufacture, and the reliability is relatively high. In the process of using the electronic device, in a case that there is no need to use the functional device 200, the functional device 200 can retract into the housing 100 by making the cam 410 rotate to the first location, so that the housing 100 provides a protection function for the functional device 200, and prevents the functional device 200 from being damaged due to a collision. In a case that there is a need to use the functional device 200, through the piezoelectric device 310, the cam 410 can rotate to the second location from the first location, and the cam 410 can drive at least part of the functional device 200 to extend out of the housing 100 from the opening of the housing 100, so that it is ensured that the functional device 200 can normally work. Moreover, because the functional device 200 is mounted in the housing 100, but not on a surface of the housing 100, the functional device 200 does not occupy the space, used for mounting the display screen, on the housing 100, and thus, the area occupied by the display screen can be expanded and the screen-to-body ratio of the electronic device can be increased.

Further, as shown in FIG. 3, the transmission mechanism 400 can further include a reset portion 420; one end of the reset portion 420 can be connected to the functional device 200, and the other end of the reset portion 420 can be connected to the housing 100; an included angle between a stretchable direction of the reset portion 420 and a movement direction of the functional device 200 can be β, and 0°≤β<90; in a case that the cam 410 is at the first location, the reset portion 420 is in a natural state; and in a case that the cam 410 is at the second location, the reset portion 420 is in a compressed state, or in a case that the cam 410 is at the second location, the reset portion 420 is in an extended state.

In the process of using the aforementioned structure, in a case that the cam 410 is at the second location, the reset portion 420 stores elastic potential energy due to being stretched or compressed, so that once the cam 410 leaves the second location, the reset portion 420 has a tend to restore deformation to release the elastic potential energy; and because the stretchable direction of the reset portion 420 has a component in the movement direction of the functional device 200, under the action of the reset portion 420, the functional device 200 can automatically retract into the housing 100.

Alternatively, the reset portion 420 can be a compression spring, and one end of the compression spring can be fixed on the housing 100, and the other end of the compression spring can be fixed on the functional device 200. In the process that the functional device 200 moves relative to the housing 100, the location of an end portion of the compression spring connected to the housing 100 is not changed relative to the housing 100, but the location of an end portion of the compression spring connected to the functional device 200 is changed along with the movement of the functional device 200 relative to the housing 100, and therefore, by designing a mounting location of the compression spring, in a case that the cam 410 rotates to the second location, the compression spring can be in the compressed state or the extended state.

For example, in a case that the end portion of the compression spring connected to the housing 100 and the end portion of the compression spring connected to the functional device 200 are arranged along an extension direction of the functional device 200, along with the execution of the process that the functional device 200 extends out of the housing 100, the end portion of the compression spring connected to the functional device 200 moves towards a direction distant from the end portion of the compression spring connected to the housing 100, so that the compression spring is stretched, and in a case that the cam 410 rotates to the second location, the compression spring can be in the extended state. Moreover, in a case that the end portion of the compression spring connected to the housing 100 and the end portion of the compression spring connected to the functional device 200 are arranged along a retraction direction of the functional device 200, along with the execution of the process that the functional device 200 extends out of the housing 100, the end portion of the compression spring connected to the functional device 200 moves towards a direction close to the end portion of the compression spring connected to the housing 100, so that the compression spring is compressed, and in a case that the cam 410 rotates to the second location, the compression spring can be in the compressed state.

Alternatively, as shown in FIG. 3, the stretchable direction of the compression spring can be parallel to the movement direction of the functional device 200, and thus, on one hand, the elastic function of the compression spring can be prevented from having a negative influence on other components, and on the other hand, the automatic retraction speed and thoroughness of the functional device 200 can further be improved. Optionally, as shown in FIG. 3, the compression spring can be mounted between the functional device 200 and the cam 410, and in a case that the cam 410 rotates to the second location, the compression spring can be in the compressed state, so that the mounting space in the electronic device can be well utilized.

Further, the transmission mechanism 400 can further include a connection portion 440; the functional device 200 can be connected to one end of the connection portion 440, and the other end of the connection portion 440 can be engaged with the cam 410, so that the engagement difficulty between the cam 410 and the functional device 200 is reduced through the connection portion 440. In detail, in the case that the connection portion 440 is provided, a distance between the mounting location of the cam 410 and the opening can be relatively large, so that it is ensured that there is a certain distance between the protruding portion 412 of the cam 410 and an edge of the housing 100, and in a case that the cam 410 drives the functional device 200 to extend out, the protruding portion 412 of the cam 410 can be prevented from being in contact with the edge of the housing 100.

Alternatively, the connection portion 440 can be of a rod-shaped connection structure, can be fixedly connected to the functional device 200 in a bonding manner and the like, or can further fix the functional device 200 to one end of the connection portion 440 through a connection member, such as a bolt. The size and shape of the connection portion 440 can be determined according to actual conditions.

Optionally, the electronic device disclosed in the embodiments of the present application can further include a guide rail 510; the guide rail 510 is fixed on the housing 100; and by enabling the connection portion 440 to be in movable engagement with the guide rail 510 along the movement direction, and enabling the connection portion 440 to engage with the guide rail 510 in a limiting manner along a direction perpendicular to the movement direction, the movement direction of the connection portion 440 can be limited, and it can be prevented that the cam 410 cannot move in the process of driving the functional device 200 through the connection portion 440 because the functional device 200 is stuck in the opening due to the deflection of the connection portion 440.

Alternatively, the guide rail 510 can be a limiting structure corresponding to the structure of the connection portion 440. For example, the connection portion 440 can be a rectangular rod-shaped structure, and then the guide rail 510 can be a rectangular cylindrical structure. The connection portion 440 is disposed in the guide rail 510, so that the connection portion 440 only can move along the movement direction of the functional device 200, and the guide rail 510 can further provide a certain guide function for the connection portion 440 to a certain extent, and improve the movement stability of the connection portion 440 and the functional device 200. Of course, the guide rail 510 can further be another type of component. For the consideration of brevity, details are not described again.

In the process of using the electronic device, in a case that the functional device 200 is supported directly through the cam 410, the functional device 200 keeps the extended state, so that the cam 410 is frequently subjected to a shear force for a long time, which easily breaks a connection relationship between the cam 410 and the piezoelectric device 310, and the actual location of the cam 410 is affected by the working state of the piezoelectric device 310. If the piezoelectric device 310 accidentally acts, it may cause that the cam 410 vibrates or rotates, and thus, the cam cannot provide a stable support effect for the functional device 200.

Further, the transmission mechanism can further include a positioning portion 450; the positioning portion 450 can be hingedly connected to the connection portion 440; the positioning portion 450 includes a positioning hook 451; and in a case that the cam 410 is at the second location, the positioning hook 451 is engaged with the positioning groove 110 in a limiting manner to limit the functional device 200 to retract into the housing 100 from the opening. In the process of using the aforementioned structure, in a case that at least part of the functional device 200 extends out of the housing 100, by enabling the positioning hook 451 to cooperate with the positioning groove 110, it can be ensured that a stable relative fixed relationship can be formed between the functional device 200 and the housing 100, and the service lives of the cam 410 and the piezoelectric device 310 can be prolonged to a certain extent.

Alternatively, as shown in FIG. 3, the positioning groove 110 can be formed at a location of the housing 100 corresponding to the positioning hook 451, so that in the process that the cam 410 drives the connection portion 440 to move, the positioning hook 451 is gradually close to the positioning groove 110, and in a case that the positioning hook 451 reaches the location of the positioning groove 110, the positioning hook 451 can stretch into the positioning groove 110, and even though after the cam 410 is detached from the second location, the functional device 200 can also fail to automatically retract into the housing 100, so that it is ensured that the functional device 200 can be stable in the state of extending out of the housing 100.

Correspondingly, in a case that there is a need to enable the functional device 200 to retract into the housing 100, on one hand, it is needed to ensure that the cam 410 rotates to the first location, and on the other hand, it is needed to enable the positioning hook 451 to be detached from the positioning groove 110, so that a limiting engagement relationship between the positioning hook 451 and the positioning groove 110 is broken. Optionally, through a corresponding connection structure, the positioning hook 451 can be detached from the positioning groove 110 in a manual operation manner, such as pulling the positioning hook 451.

Further, in order to enable the positioning hook 451 to be able to more easily form the limiting engagement relationship with the positioning groove 110, optionally, as shown in FIG. 3, the transmission mechanism 400 can further include an elastic portion 430; one end of the elastic portion 430 can be connected to the positioning hook 451, and the other end of the elastic portion 430 can be connected to the housing 100; an included angle between a stretchable direction of the elastic portion 430 and the movement direction of the functional device 200 is γ, and 0°<γ≤90°; and in a case that the cam 410 is at the first location, the elastic portion 430 is in an extended state or a compressed state.

In the process of using the aforementioned structure, in a case that the cam 410 is at the first location, the elastic portion 430 stores elastic potential energy due to being stretched or compressed, so that once the cam 410 leaves the first location, the elastic portion 430 has a tend to restore deformation to release the elastic potential energy; and because the stretchable direction of the elastic portion 430 has a component in a direction perpendicular to the movement direction of the functional device 200, no matter whether there are other influence factors, in a case that the positioning hook 451 moves to the location of the positioning groove 110, under the action of the elastic portion 430, it can be ensured that the positioning hook 451 can form a reliable limiting engagement relationship with the positioning groove 110.

Optionally, as shown in FIG. 3, in a case that the positioning hook 451 is engaged with the positioning groove 110 in a limiting manner, the stretchable direction of the elastic portion 430 can be perpendicular to the movement direction of the functional device 200, and this can maximally prevent the occurrence of a phenomenon that the positioning hook 451 is accidentally detached from the positioning groove 110. The elastic portion 430 can be an extension spring, and the elastic portion 430 is disposed between the positioning hook 451 and the positioning groove 110, so that the space between the positioning hook 451 and the positioning groove 110 is effectively utilized.

In another embodiment of the present application, the positioning portion 450 can further include a blocking segment 452; the blocking segment 452 is connected to the positioning hook 451, and is located at one side of a hinge point of the positioning portion 450 facing away from the positioning hook 451; in the process that the cam 410 rotates to the first location from the second location, the cam 410 can be in contact with the blocking segment 452; and because the blocking segment 452 and the positioning hook 451 are respectively at the opposite two sides of the hinge point of the positioning portion 450, the cam 410 can drive the positioning hook 451 to be detached from the positioning groove 110, so that it is ensured that the functional device 200 can retract into the housing 100. It should be noted that the relationships among the orientation of the positioning hook 451, the location of the blocking segment 452, and the rotation direction of the cam 410 can be correspondingly set according to actual requirements.

In order to reduce the design difficulty and control difficulty of the electronic device, the electric field direction cannot be changed in the working process of the electronic device, so that the piezoelectric device 310 drives the cam 410 to always rotate along the same direction. As shown in FIG. 4 to FIG. 8, in a case that the cam 410 clockwise rotates to the second location from the first location, the cam 410 can drive the functional device 200 to extend out of the housing 100; and as shown in the figures, in a case that the cam 410 continues to clockwise rotate to the first location from the second location, the functional device 200 can retract into the housing 100.

Figure 6:
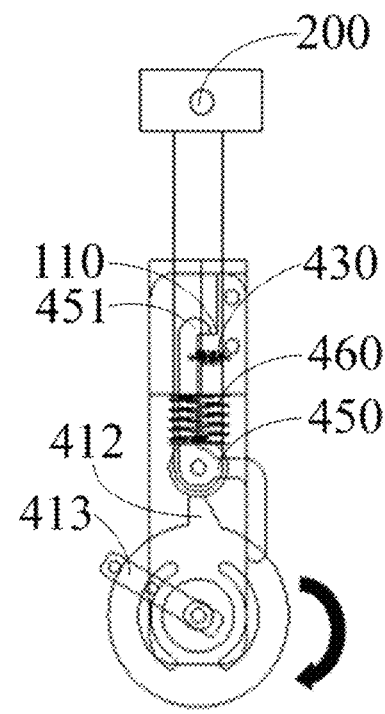
FIG. 6 is a third state diagram of parts in a movement process in an electronic device shown in FIG. 1.
Figure 7:
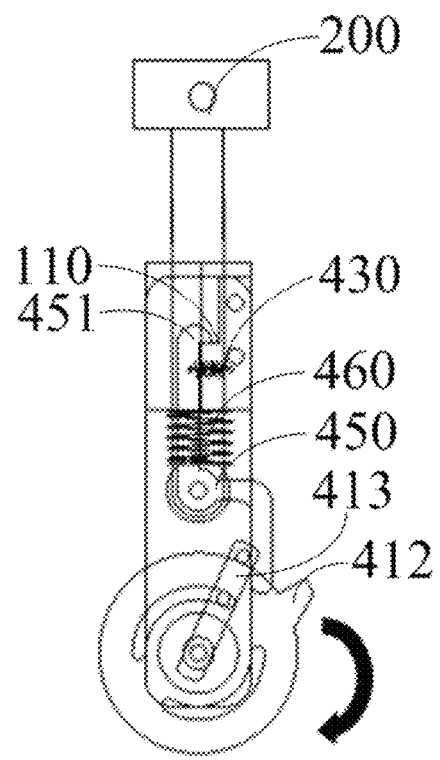
FIG. 7 is a fourth state diagram of parts in a movement process in an electronic device shown in FIG. 1.
Figure 8:
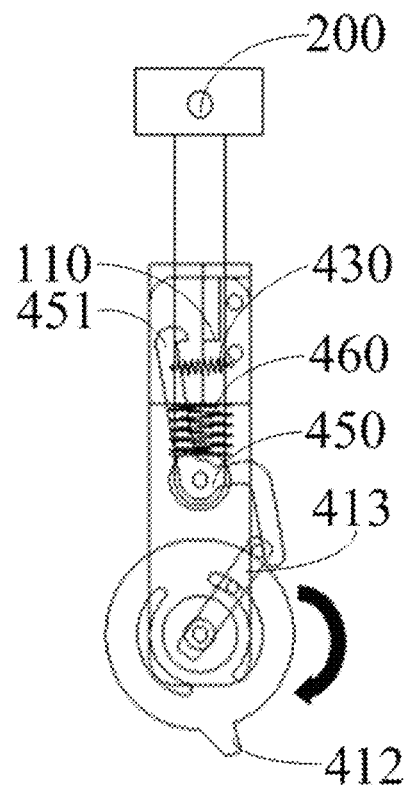
FIG. 8 is a fifth state diagram of parts in a movement process in an electronic device shown in FIG. 1.
Figure 9:
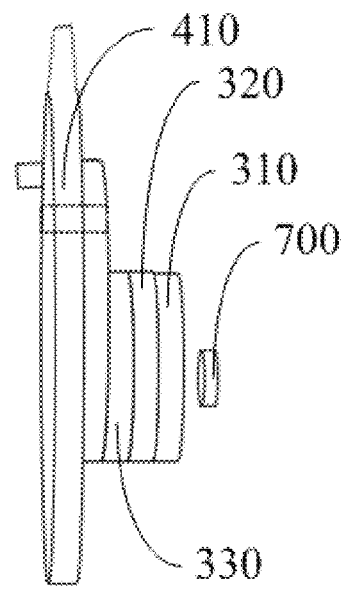
FIG. 9 is a schematic assembly diagram of a driving mechanism in an electronic device disclosed in embodiments of the present application.

In a case that the cam 410 always rotates along the same direction, more specifically, in a case that the cam 410 clockwise rotates, in order to more clearly describe the mutual relationships among the positioning hook 451, the blocking segment 452, and the cam 410, by taking the electronic device shown in FIG. 6 as an example, the functional device 200 is disposed above the cam 410, and the positioning hook 451 can be rightwards disposed, so that in the process that the cam 410 drives the connection portion 440 to upwards move, the positioning hook 451 can form the limiting engagement relationship with the positioning groove 110, so as to limit the functional device 200 from retracting into the housing 100. Meanwhile, the blocking segment 452 can be disposed at the right side of the positioning hook 451, i.e., at the downstream of the positioning hook 451. In the process that the cam 410 clockwise rotates, the cam 410 first cooperates with the positioning hook 451, and after the cam 410 continues to rotate by a certain angle, the blocking segment 452 can be in contact with the cam 410. Because the blocking segment 452 and the positioning hook 451 are located at the opposite two sides of the hinge point, in a case that the cam 410 drives the blocking segment 452 to rotate, the blocking segment 452 moves towards an upper right direction and the positioning hook 451 moves towards a lower left direction and can be detached from the positioning groove 110, and then under the action of the reset portion 420, the functional device 200 can automatically retract into the housing 100.

Optionally, the cam 410 can further include a rotating rod 413; the rotating rod 413 is connected to the wheel body 411; in the process that the cam 410 rotates towards the first location from the second location, the rotating rod 413 is in contact with the blocking segment 452 to drive the positioning hook 451 to be detached from the positioning groove 110. By additionally providing the rotating rod 413 and enabling the rotating rod 413 to engage with the blocking segment 452, the functions and roles of the components in the cam 410 are more single, so that in the process of structure design, the design difficulty of the protruding portion 412, the rotating rod 413, the blocking segment 452 and other components is reduced.

Moreover, in order to prevent the protruding portion 412 from colliding with the blocking segment 452 during rotation, optionally, the rotating rod 413 and the protruding portion 412 can be arranged along the axial direction of the wheel body 411, and the blocking segment 452 is located at one side of the wheel body 411 where the rotating rod 413 is located, so that the blocking segment 452 and the protruding portion 412 are located at different planes, and it is ensured that the protruding portion 412 does not collide with the blocking segment 452 in the process of rotating along with the wheel body 411.

In a case that the cam 410 always rotates along the same direction, in order to enable the response speeds of the functional device 200 in the extension process and in the retraction process to relatively approach to each other, optionally, a preset included angle can be formed between the protruding portion 412 and the rotating rod 413, so that in the processes that the functional device 200 extends and retracts, the angles by which the protruding portion 412 rotates are closer to each other, and thus, it is prevented that the response speed of an extension action or a retraction action of the functional device 200 is too slow, and the user experience is improved.

Further, as shown in FIG. 3, a guide surface 412a can be formed on the protruding portion 412, and the location of the guide surface 412a is associated with the rotation direction of the cam 410. Alternatively, in the process that the cam 410 rotates to the second location from the first location, a surface of the protruding portion 412 that is in contact with the functional device 200 is the guide surface 412a, and under the action of the guide surface 412a, the functional device 200 can more easily move onto the protruding portion 412 of the cam 410 from the wheel body 411 of the cam 410, and the movement process of the functional device 200 can be smoother and more stable. Alternatively, as shown in FIG. 3, a guide portion can be an inclined plane, or the guide surface 412a can also a smooth curved surface. Of course, in a case that the functional device 200 is connected to one end of the connection portion 440, in the process that the cam 410 rotates to the second location from the first location, the end portion of the functional device 200 facing away from the connection portion 440 is in contact with the guide surface 412a of the protruding portion 412.

In order to further ensure that the cam 410 can more reliably drive the functional device 200 to move, optionally, the transmission mechanism can further include a pulley 460. The pulley 460 is fixed to one end of the functional device 200 facing the cam 410, and the pulley 460 is movably connected to the housing 100 along the movement direction of the functional device 200. In the process that the cam 410 rotates, the cam 410 can engage with the pulley 460 in a rolling manner, and this can reduce the rotation resistance of the cam 410. Moreover, in a case that the protruding portion 412 of the cam 410 rotates to a location where the pulley 460 is located, the pulley 460 can further provide a certain guide function for the rotation of the protruding portion 412, and thus, it is easier for the protruding portion 412 of the cam 410 to rotate between the pulley 460 and the wheel body 411, so as to drive the pulley 460 to move towards a direction facing away from the wheel body 411 to drive the functional device 200 to extend out of the housing 100.

Alternatively, the axle of the pulley 460 can be movably connected to the housing 100, and the functional device 200 can be connected to the axle of the pulley 460. Optionally, the functional device 200 can be connected to the axle of the pulley 460 through the connection portion 440. In addition, as shown in FIG. 2, the reset portion 420 can be sleeved on the connection portion 440, so that the connection portion 440 can further provide a certain guide function for the reset portion 420, and prevent the reset portion 420 from being bent or deformed when being compressed. Optionally, one end of the reset portion 420 can be fixed on the housing 100, and the other end of the reset portion can be fixed on the connection portion 440.

Further, the driving mechanism 300 can further include a wear-resistant layer 330. The wear-resistant layer 330 can be fixed at one side of the cam 410 facing the piezoelectric device 310, so that in the working process of the piezoelectric device 310, by enabling the wear-resistant layer 330 to be in contact with the piezoelectric device 310, the service life of the transmission mechanism 400 can be prolonged, and the cam 410 can be prevented from being damaged. Optionally, the wear-resistant layer 330 can be formed of a carbon nano-material, and a thickness of the wear-resistant layer can be determined according to an actual requirement.

Optionally, the driving mechanism 300 can further include an elastic layer 320; the elastic layer 320 is an elastic structural member, and the elastic layer 320 can be fixed to one side of the piezoelectric device 310 facing the cam 410 in a bonding manner and the like; and the elastic layer 320 can generate a relatively large amount of deformation in the working process of the piezoelectric device 310, and under the action of a larger amount of deformation, it can further be ensured that the cam 410 can generate a rotation action along a preset direction. Optionally, the elastic layer 320 can be formed of a metal copper material and be of a sheet-shaped structure, so that it is ensured that the elastic layer 320 has a relatively large elastic capability and further has relatively high structural strength. In a case that the electronic device is a smart watch, the piezoelectric device 310 can be disposed parallel to a dial to reduce the whole thickness of the electronic device. In addition, as shown in FIG. 1, an operation button 800 can further be disposed on a watch case, and the operation button 800 can be disposed at one side of the watch case facing away from the opening. In the process of using the electronic device, a corresponding operation can be performed on the electronic device through the operation button 800. For example, a volume adjustment function of the electronic device can be implemented through the operation button 800, and correspondingly, the functional device 200 can also be driven to move through the operation button 800.

Optionally, the electronic device disclosed in the embodiments of the present application is the smart watch; the housing 100 can be the watch case; the smart watch further includes a watch band 600; and the watch band 600 is connected to the watch case. The watch case can be formed of a metal and the like, and can be a square structure, a round structure, or the like. The watch band 600 can be formed of plastic, a fiber, a corium, or the like; a clamping detachable connection relationship between the watch band 600 and the watch case can be formed through a spring bar; and the watch band 600 can be of a segmented structure, and can also be of an integrated structure.

Further, a preset included angle $\alpha$ is formed between the watch band 600 and the opening of the housing 100, and $0° < \alpha \leq 90°$. In this case, the functional device 200 can be prevented from being hindered by the watch band 600 as much as possible in the process of extending out of the housing 100. Optionally, the preset included angle $\alpha$ between the watch band (600) and the opening can be equal to 90°, so that the watch band (600) and the opening are located at different sides of the housing (100), and the watch band (600) can be maximally prevented from hindering the extension and retraction processes of the functional device (200).

The descriptions of the aforementioned embodiments of the present application focus on differences between the embodiments. As long as different optimized features between the embodiments are not contradictory, they can be combined to form a more preferred embodiment. Further descriptions are omitted herein for the purpose of brevity.

The foregoing descriptions are only for the embodiments of the present application, but are not intended to limit the present application. Persons skilled in the art can make modifications and variations on the present application. Any modifications, equivalent substitutions, improvements, etc. made within the spirit and principle of the present application should be included within the scopes of protection of the claims of the present application.

What is claimed is:

1. An electronic device, comprising:
   a housing (100), provided with an opening and a positioning groove (110);
   a functional device (200), movably mounted on the housing (100);
   a driving mechanism (300), mounted in the housing (100) and comprising a piezoelectric device (310), wherein the piezoelectric device (310) vibrates when being energized; and
   a transmission mechanism (400), comprising a cam (410), a connection portion (440) and a positioning portion (450), wherein the functional device is connected to one end of the connection portion (440), and the other end of the connection portion (440) is configured to engage with the cam (410), the positioning portion (450) is hingedly connected to the connection portion (440), the positioning portion (450) comprises a positioning hook (451), the cam (410) is disposed at an inner side of the functional device (200), the cam (410) comprises a wheel body (411) and a protruding portion (412), the protruding portion (412) is disposed at a wheel rim of the wheel body (411), the wheel body (411) is mounted on the piezoelectric device (310), and the piezoelectric device (310) drives the cam (410) to rotate between a first location and a second location;
   wherein in a case that the cam (410) is at the first location, the functional device (200) is located in the housing (100), and in a case that the cam (410) is at the second location, the protruding portion (412) drives at least part of the functional device (200) to extend out of the housing (100) from the opening, and the positioning hook (451) is engaged with the positioning groove (110) in a limiting manner to limit the functional device (200) to retract into the housing (100) from the opening.

2. The electronic device according to claim 1, wherein the transmission mechanism (400) further comprises a reset portion (420); one end of the reset portion (420) is connected to the functional device (200), and the other end of the reset portion (420) is connected to the housing (100); an included angle between a stretchable direction of the reset portion (420) and a movement direction of the functional device (200) is β, and 0°≤β<90°; in a case that the cam (410) is at the first location, the reset portion (420) is in a natural state; and in a case that the cam (410) is at the second location, the reset portion (420) is in a compressed state, or in a case that the cam (410) is at the second location, the reset portion (420) is in an extended state.

3. The electronic device according to claim 1, wherein the transmission mechanism (400) further comprises an elastic portion (430); one end of the elastic portion (430) is connected to the positioning hook (451), and the other end of the elastic portion (430) is connected to the housing (100); an included angle between a stretchable direction of the elastic portion (430) and a movement direction of the functional device (200) is γ, and 0°<γ≤90°; and in a case that the cam (410) is at the first location, the elastic portion (430) is in an extended state or a compressed state.

4. The electronic device according to claim 1, wherein the positioning portion (450) further comprises a blocking segment (452); the blocking segment (452) is connected to the positioning hook (451), and the blocking segment (452) is located at one side of a hinge point of the positioning portion (450) facing away from the positioning hook (451); and in the process that the cam (410) rotates towards the first location from the second location, the cam (410) is in contact with the blocking segment (452) to drive the positioning hook (451) to be detached from the positioning groove (110).

5. The electronic device according to claim 4, wherein the cam (410) further comprises a rotating rod (413); the rotating rod (413) is connected to the wheel body (411); the rotating rod (413) and the protruding portion (412) are arranged along an axial direction of the wheel body (411), and the blocking segment (452) is located at one side of the wheel body (411) where the rotating rod (413) is located; and in the process that the cam (410) rotates towards the first location from the second location, the rotating rod (413) is in contact with the blocking segment (452) to drive the positioning hook (451) to be detached from the positioning groove (110).

6. The electronic device according to claim 1, further comprising a guide rail (510), wherein the guide rail (510) is fixed to the housing (100); the connection portion (440) is in movable engagement with the guide rail (510) along the movement direction; and the connection portion (440) is engaged with the guide rail (510) in a limiting manner along a direction perpendicular to the movement direction.

7. The electronic device according to claim 1, wherein the protruding portion (412) is provided with a guide surface (412a); and in the process that the cam (410) rotates towards the second location from the first location, a surface of the protruding portion (412) that is in contact with the functional device (200) is the guide surface (412a).

8. The electronic device according to claim 1, wherein the transmission mechanism (400) further comprises a pulley (460); the pulley (460) is fixed to one end of the functional device (200) facing the cam (410), and the pulley (460) is movably connected to the housing (100) along the movement direction of the functional device (200); and the cam (410) is engaged with the pulley (460) in a rolling manner.

9. The electronic device according to claim 1, wherein the driving mechanism (300) further comprises a wear-resistant layer (330); and the wear-resistant layer (330) is fixed to one side of the cam (410) facing the piezoelectric device (310).

10. The electronic device according to claim 1, wherein the driving mechanism (300) further comprises an elastic layer (320); the elastic layer (320) is an elastic structural member; and the elastic layer (320) is fixed to one side of the piezoelectric device (310) facing the cam (410).

11. The electronic device according to claim 1, wherein the electronic device is a smart watch; the housing (100) is a watch case; the smart watch further comprises a watch band (600); and the watch band (600) is connected to the watch case.

12. The electronic device according to claim 11, wherein a preset included angle α is formed between the watch band (600) and the opening, and 0°<α≤90°.

13. The electronic device according to claim 11, wherein the functional device (200) comprises at least one of a camera, a sensor, a receiver, or a light supplementing lamp.

* * * * *